United States Patent [19]

[11] 3,761,830

Claverie

[45] Sept. 25, 1973

[54] VARIABLE-GAIN LOW-NOISE AMPLIFIER

[75] Inventor: Claude Claverie, Paris, France

[73] Assignee: Thomson-CSF, Paris, France

[22] Filed: Feb. 14, 1972

[21] Appl. No.: 225,735

[30] Foreign Application Priority Data

Nov. 2, 1971 France .............................. 7139217

[52] U.S. Cl. .................... 330/29, 330/25, 330/30 D, 330/85

[51] Int. Cl. ............................................. H03g 3/30

[58] Field of Search ...................... 330/25, 29, 30 D, 330/69, 85, 96

[56] References Cited

UNITED STATES PATENTS 3,533,005 10/1970 Alm ..................................... 330/29

*Primary Examiner*—Roy Lake
*Assistant Examiner*—James B. Mullins
*Attorney*—John W. Malley et al.

[57] ABSTRACT

A transistorized variable-gain amplifier amplifies an alternating input current $I_e$ to deliver an alternating current $I_s$ of constant amplitude. For this purpose the alternating input current is amplified proportionately to the variations in the current $I_s$ about the desired output value. Moreover, in order to increase the signal-to-noise ratio, the input direct current added to the alternating current $I_e$, is made proportional to the amplitude of $I_e$; the current $I_s$ is separated from the amplified direct current, so as to be directed to the output of the amplifier.

2 Claims, 3 Drawing Figures

VARIABLE-GAIN LOW-NOISE AMPLIFIER

The present invention relates to variable-gain low-noise amplifiers in particular for television applications.

It will be remembered that the transmission of a signal involves losses which increase with the frequency of the transmitted signal and the length of the transmission path and which vary with the nature of said path, so that it is often essential, prior to the transmission of the signal or after its reception, to effect amplification proportional to losses in order to retain a constant amplitude in the transmitted signal. The problem occurs for example in television in the context of the signals exchanged between the television camera and its control unit.

The amplifier must be capable of effecting this amplification automatically and must therefore have a variable gain the control of which is carried out as a function of the detected losses. This amplifier must on the other hand introduce the least possible noise component into the signal.

The present invention has for its object a variable-gain amplifier producing an output signal in which the noise component is reduced in relation to that appearing in conventional variable-gain amplifiers.

According to the invention, there is provided a variable-gain amplifier for amplifying an input alternating current, said amplifier having an input and an output and comprising : a transistored differential amplifier having two difference inputs, an output, and a supply input; first means for applying to said supply input the sum of said input alternating current and of a variable direct current having a magnitude proportional to the amplitude of said input alternating current; means for directing to said output of said amplifier the alternating component of the amplified current appearing at said output of said differential amplifier ; and an automatic gain control device coupled to said output of said amplifier for applying a control voltage between said difference inputs.

Figure 1:
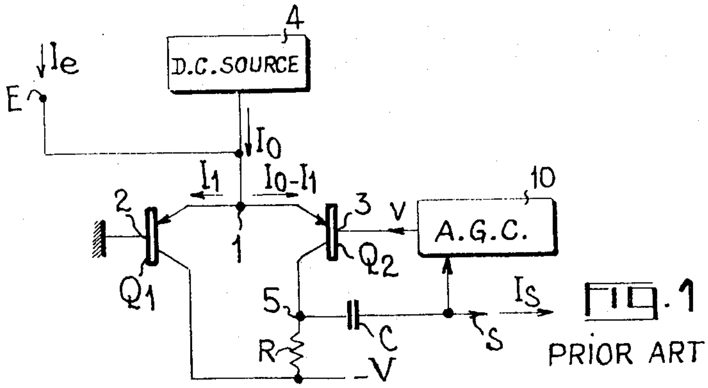
FIG. 1 PRIOR ART
Figure 2:
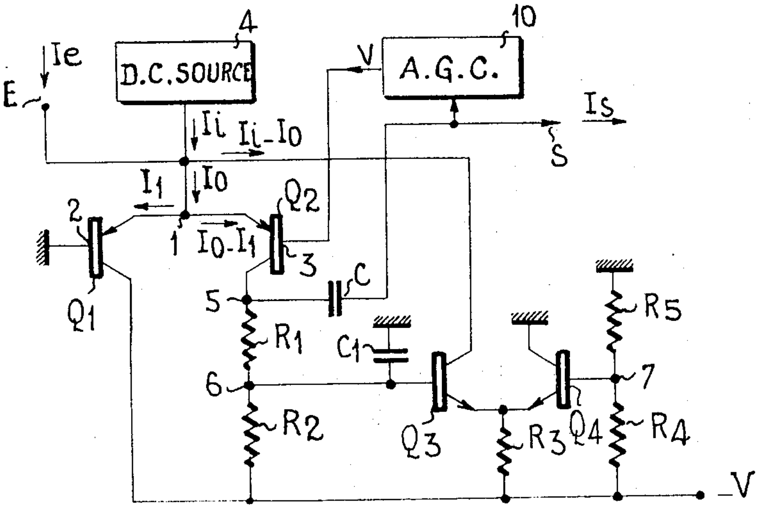
Figure 3:
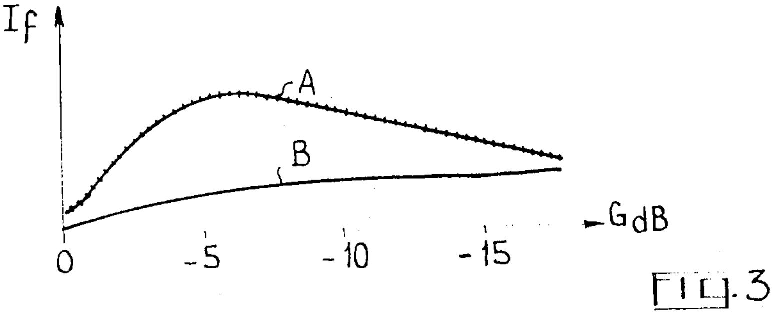

Other features will become apparent and the invention better understood from a consideration of the ensuing description and the appended drawings in which:

— FIG. 1 schematically illustrates an embodiment of a prior art variable-gain amplifier ;

— FIG. 2 schematically illustrates an embodiment of a variable-gain amplifier in accordance with the invention ;

— FIG. 3 illustrates a comparative diagram showing the improvement achieved by the invention.

In FIGS. 1 and 2, the corresponding elements are marked by the same symbols.

FIG. 1 illustrates two identical PNP transistors $Q_1$ and $Q_2$ connected as a differential amplifier ; the emitters of the two transistors are connected, at 1, to a d.c. source 4 and to the input terminal E of the circuit. The base 2 of the transistor $Q_1$ is grounded, base 3 of the transistor $Q_2$ being used as an automatic gain control input. The collector of the transistor $Q_2$ is connected to the output S of the amplifier through a coupling capacitor C and to a negative voltage source, $-V$ , through a resistor R. The collector of the transistor $Q_1$ is directly connected to this same source.

The input alternating current $I_e$, is applied to the input E of the circuit ; the source 4 supplies a constant current $I_o$ t 1. To the base 3 of the transistor $Q_2$ there is applied through a control circuit 10, a control voltage $v$ which is a function of the difference between the amplitude of the amplified signal and the corresponding assigned value ; to this end, the circuit 10 is connected by its input to the output S and its output voltage $v$ is regulated so that it has a slightly positive value when the amplitude of the amplified signal is too high, the transistor $Q_2$ tending then to block and its gain dropping towards zero. By contrast, if the signal is not sufficiently amplified, $v$ has a negative value and the more negative this value is the more the transistor $Q_2$ conducts, its gain then tending towards unity since $Q_1$ tends towards the blocked condition.

The current $I_o$ is split at the point 1 into two currents $I_1$ and $I_o - I_1$ which respectively flow across the transistors $Q_1$ and $Q_2$ to reappear practically unaltered at their collectors. The value of $I_o - I_1$ and therefore of $I_1$, is a function of the condition of the transistor $Q_2$; $I_o - I_1$ will be at a minimum (close to zero) , when $v$ is sufficiently positive to block $Q_2$ , and $I_o - I_1$ will be at a maximum (close to $I_o$) when v is sufficiently negative to drive $Q_2$ fully conductive ; $I_o - I_1$ can of course assume any intermediate value under the control of the voltage $v$.

The current $I_e$ is distributed in the same way as the current $I_o$ between the two transistors $Q_1$ and $Q_2$ . Thus, on the collector output 5 of the transistor $Q_2$ there appears a direct current $I_o - I_1$ and a current $I_s$ resulting from the amplification of the input alternating current $I_e$. This current $I_s$ , which is separated from the current $I_o - I_1$ by the coupling capacitor C, appears at S and follows the variations $I_o - I_1$ so that the circuit described, through the voltage $v$, restores the amplitude of $I_s$ to the controlled value as soon as said amplitude tends to deviate.

Thus the current $I_s$ can be rendered virtually constant whatever the value adopted by $I_e$ in the operating range of the amplifier.

It will be observed that in the circuit, the terminal 1 constitutes the supply input of the differential amplifier and that the terminals 2 and 3, between which the control voltage is applied, constitute the "difference" inputs.

The circuit which has just been described is used but is not always entirely satisfactory by reason of the noise which it introduces into the signal, and the circuit in FIG. 2 enables improvement in the signal-to-noise ratio to be achieved.

The circuit of FIG. 2 comprises the circuit of FIG. 1, which this difference that the resistor R of FIG. 1 is substituted by two serially connected resistors $R_1$ and $R_2$ . The circuit of FIG. 2 , in addition, comprises an NPN transistor $Q_3$, which forms a differential amplifier in association with an identical transistor $Q_4$. The collector of the transistor $Q_3$ is connected the connection point 1. The emitters of the transistors $Q_3$ and $Q_4$ are connected through a resistor $R_3$ to the negative voltage source $-V$ ; the base 7 of the transistor $Q_4$ is connected on the one hand to this negative voltage source $-V$ through a resistor $R_4$ and on the other grounded through a resistor $R_5$. The collector of the transistor $Q_4$ is grounded. The base 6 fof the transistor $Q_3$ is connected to the voltage source $-V$ through a resistor $R_2$ , to the point 5 through the resistor $R_1$ and connected to ground through a decoupling capacitor $C_1$ , which gives the transistor $Q_3$ a high output a.c. impedance.

In this circuit, the source 4 produces a constant direct current $I_t$ and the direct current $I_0$ supplied at 1 is no longer constant but, as indicated hereinafter is controlled as a function of the peak-to-peak amplitude 2 $I_e$ of the input alternating current, the mean current through the transistor $Q_2$ being maintained constant.

Because of the high impedance presented to the alternating current $I_e$ by the transistor $Q_3$, the circuit operates, as concerns the input a.c. signal, in the same way as the circuit of FIG. 1, $I_e$ being split into two currents one flowing through the transistor $Q_1$ and the other through the transistor $Q_2$, the values of these currents being a function of the control voltage $v$ applied to the base of the transistor $Q_2$.

G designating the gain of the transistor $Q_2$, the collector of the transistor $Q_2$ will deliver a direct current $GI_0$ biases the base of $Q_3$. The resistances of resistors $R_2$, $R_4$, $R_5$ are chosen so that the base voltages of the transistors $Q_3$ and $Q_4$ impose a certain predetermined value J on $GI_0$, for example the peak-to-peak value of $I_s$; the current $I_t - I_0$ which is drawn by the collector of $Q_3$ then assumes a value which is a function of $R_3$. If $GI_0$ is less than J, the voltage on the base 6 of the transistor $Q_3$ becomes less than the voltage on the base of the transistor $Q_4$, $Q_3$ tending then to draw a smaller proportion of the current $I_t$ and enabling $I_0$ to increase, so that the result is an increase of $GI_0$ and equilibrium is established when $GI_0 = J$.

The reverse procedure takes place when $GI_0$ is greater than J.

Thus $GI_0$ is controlled so as to have a constant value J which, since $GI_e = I_s$ is likewise controlled so as to have a constant value, means that $I_0$ is controlled to a value which is proportional to the peak-to-peak value 2 $I_e$ of the input alternating current $I_e$, in the case where $GI_0$ is controlled to the value to which $I_s$ is controlled, $I_0$ is controlled so as to have the value 2 $I_e$. To avoid distortion of the amplified alternating current, $I_0$ should of course be given a value at least equal to $I_e$ For safety's sake, $I_0$ will generally be chosen substantially greater for example equal to 2 $I_e$.

It will be observed that in the differential amplifier formed by the transistors $Q_3$, $Q_4$, the supply input is constituted by the collector of $Q_3$ and that the terminals 6 and 7, between which the variation in the direct component of the amplified current is applied, are difference inputs.

Experience has shown and calculation in fact confirms, that the curve plotting the r.m.s. value $I_f$ of the noise current as a function of the gain G, is given by the curve B of FIG. 3, for the circuit in accordance with the invention ; the curve A, given by way of reminder and comparison, is the corresponding curve for the case of the circuit shown in FIG. 1.

Self-evidently, the invention is not limited to the embodiment described and is applicable to any variable-gain amplifier utilising the principle in accordance with which the direct component of the current flowing through the amplifier element proper of the circuit ($Q_2$ in the circuit shown in FIG. 2), is maintained constant whatever the specific type of transistor used and whatever the kind of control employed to keep the current $I_0$ at a value proportional to the peak-to-peak current of the input signal.

Of course, the invention is not limitated to the embodiment described and shown which was given solely by way of example.

I claim:

1. A variable gain amplifier for amplifying an input alternating current, said amplifier having an output and comprising: a transistorized differential amplifier having two difference inputs, an output, and a supply input ; first means for applying said input alternating current to said supply input ; a d.c. supply circuit, including a d.c. source having an output, for feeding an input direct current to said supply input ; second means, having first and second terminals coupled to said output of said differential amplifier, for respectively directing to said first terminal, forming said output of said variable gain amplifier, the amplified alternating current appearing at said differential amplifier output and to said second terminal the amplified direct current appearing at said differential amplifier output ; and a control circuit coupled for receiving the currents respectively appearing at said first and second terminals, and having first and second outputs respectively coupled to one of said difference inputs and to said d.c. supply circuit for respectively varying the gain of said variable gain amplifier and the flow of said input direct current so as to maintain at respective constant values the currents appearing at said first and second terminals.

2. A variable gain amplifier as claimed in claim 1, wherein said control circuit includes an auxiliary differential amplifier having two difference inputs one of which is coupled to said second terminal and an output forming said control circuit second output, said outputs of said auxiliary differential amplifier and of said d.c. source being connected together, and wherein said control circuit further comprises an automatic gain control circuit having an input coupled to said first terminal and an output forming said first output of said control circuit.

* * * * *